Jan. 15, 1957 R. D. TOLLEFSON 2,777,953

SYSTEM FOR CALIBRATING OSCILLATORS

Filed Oct. 6, 1955

INVENTOR.
ROBERT D. TOLLEFSON
BY Moody and Goldman
ATTORNEYS

United States Patent Office 2,777,953

Patented Jan. 15, 1957

2,777,953

SYSTEM FOR CALIBRATING OSCILLATORS

Robert D. Tollefson, Cedar Rapids, Iowa, assignor to Collins Radio Company, Cedar Rapids, Iowa, a corporation of Iowa Application October 6, 1955, Serial No. 538,925

9 Claims. (Cl. 250—36)

This invention relates to a system for calibrating the output frequency of an oscillator.

The invention may be used wherever it is required to calibrate the relationship between an oscillator's actual output frequency and its indicated output frequency. When the oscillator is installed in a heterodyne radio receiver, the invention may be used to calibrate the actual incoming frequency versus the indicated incoming frequency, since the received frequency is a function of oscillator calibration. Furthermore, the invention may be used where the tuning means is a mechanical tuning shaft or an electrical control means, such as a control voltage.

The invention is particularly useful in the calibration of oscillators that are part of an assembled radio receiver, because many of the components in the receiver may be used as part of the calibration system to thereby simplify the construction of the calibration equipment and lower its cost.

It is an object of this invention to provide an oscillator calibration system that is simple to use and that provides an instantaneous indication of calibration error in order to permit oscillator alignment to proceed at a fast pace.

The invention may have, as one of its components, a standard oscillator which is precalibrated and is the same type of oscillator as those which are to be calibrated. The tuning means of the precalibrated oscillator is coupled to the tuning means of the oscillator which is to be calibrated.

The output from a fixed stable frequency source is mixed with the frequency output of the precalibrated oscillator to provide sum and difference frequencies; and either the sum or difference frequency is passed by a filter and is used as a "calibrating frequency."

The output of the oscillator, which is being calibrated, is mixed with the "calibrating frequency" to provide a second mixed output, which contains the frequency error of the oscillator being calibrated. An intermediate-frequency amplifier, which is tuned to the frequency of the fixed stable source, receives the second mixed output.

A frequency-detection means, such as a discriminator, receives the output of the intermediate-frequency amplifier and is tuned to the fixed stable frequency to provide a direct-voltage output proportional to the deviation of the received intermediate-frequency from the fixed stable frequency. This deviation is proportional to the calibration error.

A voltmeter may be used to indicate the output of the frequency-detection means; and its scale may be calibrated in terms of the amount of frequency error for the oscillator being calibrated.

Where it is impractical to provide substantially perfect calibration for the standard oscillator, the invention also teaches how it may be left uncalibrated, and how the "calibrating frequency" may instead be directly calibrated using cam means between the tuning means and the stable frequency source.

Further objects, advantages and features of the invention will be apparent to a person skilled in the art upon further study of the specification and drawings, in which.

Figure 1:
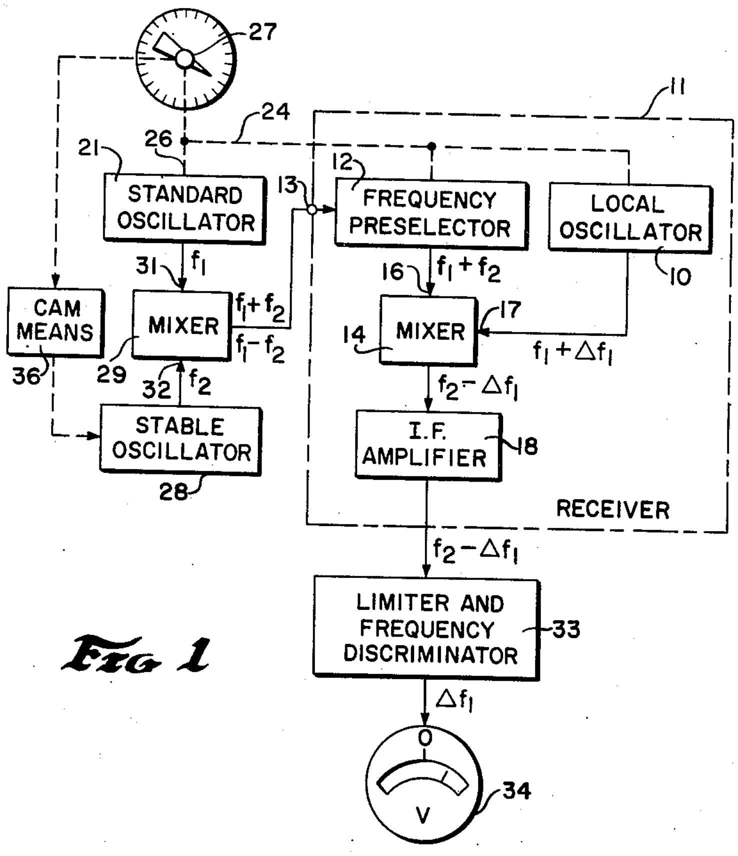
Figure 1 illustrates a block diagram of the invention.

Now referring to the invention in more detail, Figure 1 shows an arrangement for calibrating an oscillator 10 which is part of an assembled receiver 11. Receiver 11 is a superheterodyne type and its oscillator 10 is to be calibrated so that the frequency indication of the receiver is accurate. Receiver 11 has among its conventional components: a frequency preselector 12, which has its input connected to the antenna lead-in terminals 13 of the receiver; a mixer 14 which has one input 16 connected to the output of frequency preselector 12 and has its other input 17 connected to the output of local oscillator 10; and an intermediate-frequency amplifier 18, which has its input connected to the output of mixer 14 to filter the difference frequency between the inputs to mixer 14.

The invention requires a standard oscillator 21, which has the required range and tuning characteristics of oscillator 10 in the receiver. Thus, standard oscillator 21 preferably is constructed identically to receiver oscillator 10 and in one form of the invention is precalibrated by conventional methods, which, for example, might be done with an accurate signal generator using laborious point by point frequency comparison.

Figure 2:
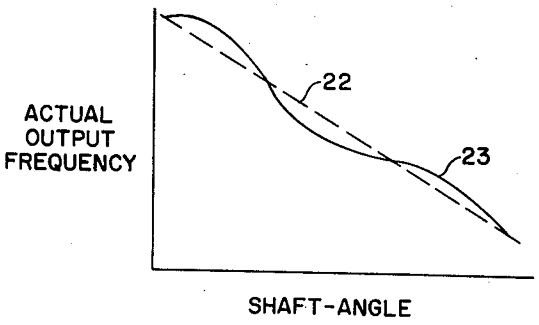
Figure 2 illustrates one type of variation between the output frequency and the indicated frequency for each of two oscillators.

The form of the invention herein described will assume that precalibrated oscillator 21 is mechanically tuned and has a linear relationship between shaft-rotation and output frequency, which is shown as dotted line 22 in Figure 2. Receiver oscillator 10, which, when uncalibrated, may have the output frequency versus shaft-rotation characteristic shown in Figure 2 by solid line 23.

Receiver 11 has a tuning shaft 24 that selects the tuned frequency of the receiver; and shaft 24 couples to frequency preselector 12 and oscillator 10 to tune them, as required, to the incoming carrier-frequencies that are to be received.

The tuning shaft 26 of precalibrated oscillator 21 is coupled to receiver tuning shaft 24 so that they rotate together with a minimum of backlash. A knob 27 is provided for rotating the shafts in unison. Various types of coupling means may be used, and a preferred one will depend upon the particular mechanical layout of the receiver and precalibrated oscillator. In many cases, a direct coupling may be used, for example, by aligning shaft 26 of precalibrated oscillator 21 with the receiver tuning shaft 24 and coupling them together with an oldham coupler. In other cases, it may be necessary to couple the two shafts together through anti-backlash gear transmission means having a one-to-one ratio.

A stable oscillator 28 is provided which may provide a single-fixed-frequency output $f_2$, that is equal to the intermediate frequency of receiver 11. Accordingly, stable oscillator 28 may be a crystal oscillator.

A mixer 29 has one input 31 connected to the output of standard oscillator 21 and the other input 32 connected to the output of stable oscillator 28. Mixer 29 may be a simple mixer arrangement using, for example, a single tube or semiconductor diode with a load resistor. Accordingly, the output of mixer 29 will include a sum-frequency, $f_1+f_2$, and a difference-frequency, $f_1-f_2$, as well as numerous spurious frequency outputs.

The output of first mixer 29 is provided to the antenna terminals 13 of the receiver and, in turn, is passed to frequency preselector 12, which filters the mixer components to automatically select the frequency required by the invention. This frequency is called herein the "calibrating frequency" and is either the sum-frequency or the difference-frequency defined above. In Figure 1, it is assumed that preselector 12 passes only the sum-frequency, $f_1+f_2$.

Whether the sum-frequency or the difference-frequency is selected by preselector 12 depends upon whether the receiver uses a high or a low injection of the local oscillator frequency. Where the local oscillator provides a low injection, the sum-frequency is selected, and where the local oscillator provides a high injection, the difference-frequency is selected. Although receiver design will vary in this regard, this invention will automatically select the proper frequency. In the example of Figure 1, low receiver injection is presumed; and accordingly, frequency preselector 12 passes the sum-frequency, $f_1+f_2$.

Local oscillator 10 provides an output frequency, $f_1+\Delta f_1$, which is equal to the output frequency of standard oscillator 21 plus a frequency error, which is $\Delta f_1$. Second mixer 14 will consequently receive as one input the calibration frequency, $f_1+f_2$, and as another input the local oscillator frequency, $f_1+\Delta f_1$.

Receiver intermediate-frequency amplifier 18 is an active filter which has a fixed bandpass, as is conventional in superheterodyne receivers. The difference frequency between the two input frequencies to receiver mixer 14 provides the frequency, $f_2-\Delta f_1$, which falls directly within the I. F. bandpass, if the error frequency $\Delta f_1$ is not too large, since frequency $f_2$ was chosen equal to the tuned I. F. frequency of the receiver, as stated above.

Generally, the oscillator error-frequency $\Delta f_1$ has been found to fall within the bandpass of the receiver I. F. amplifiers, since such amplifiers usually have a bandpass of many kilocycles. However, where the error-frequency $\Delta f_1$ is generally found to be the same order or larger than the bandpass, the I. F. amplifier of the receiver should not be used; and an amplifier having a sufficiently broad-band is substituted for I. F. amplifier 18 in Figure 1 and is tuned to the I. F. frequency or operates as a low-pass filter which cuts-off at a frequency substantially above the I. F. frequency. Amplitude clipping means following amplifier 18 broadens its effective bandwidth.

A limiter and frequency discriminator 33, which also might be a ratio-detector, has its input connected to the output of receiver I. F. amplifier 18. The output of discriminator 33 is a direct-voltage which varies in proportion to error-frequency $\Delta f_1$ since the center-frequency of the discriminator is chosen to be frequency $f_2$. Where the receiver is designed to receive frequency-modulation rather than amplitude-modulation, limiter and frequency discriminator 33 may be components provided as part of receiver 11 to, accordingly, further eliminate extra components required to construct this invention. A voltmeter 34 is connected to the output of the discriminator 33 and may have its scale calibrated in terms of error-frequency, $\Delta f_1$. For example, the center of the voltmeter scale may indicate zero error, the scale portion to the right may indicate positive error, and the scale portion to the left of zero may indicate negative error.

In operating the invention, knob 27 may be rotated to vary the output frequency $f_1$ of precalibrated oscillator 21 over its frequency range. If the local oscillator 10 is calibrated identically with standard oscillator 21, the needle of voltmeter 34 will continually indicate zero volts throughout the tuning operation.

However, if a lack of calibration exists at some part of the tuning range, voltmeter 34 will then indicate either a positive or a negative voltage in Figure 1. A positive voltage will indicate that the local oscillator frequency deviates above the required frequency and, accordingly, causes a positive $\Delta f_1$; while a negative voltage indicates that the local oscillator frequency is below the required frequency and, accordingly, causes a negative $\Delta f_1$.

Therefore, in Figure 2, a positive voltmeter indication will be obtained when local oscillator frequency 23 goes above the standard oscillator frequency 22; and a negative voltmeter indication will be obtained when local oscillator frequency 23 goes below standard oscillator frequency 22. Where an error is found in any part of the tuning range, local oscillator 10 may be adjusted to provide zero error at that part and, in turn, over its whole frequency range.

In some cases, it may be impractical, if not impossible, to obtain substantially perfect calibration for standard oscillator 21. In this case, the invention also provides means for compensating frequency errors of the standard oscillator, so that those errors will not affect the calibration of the receiver oscillator, or any other oscillator being calibrated. The accuracy of the invention is dependent on the accuracy of the "calibrating frequency," which is the output of preselector 12. In turn, the accuracy of the "calibrating frequency" is not only dependent upon the accuracy of the standard oscillator, but also upon the accuracy of stable oscillator 28. It then follows that inaccuracies in the output of standard oscillator 21 can be compensated by counteracting-frequency variations in the output of the stable oscillator 28. For example, standard oscillator 21 may not have sufficient adjustment means to be perfectly calibrated over its entire tuning range.

Thus, in Figure 1, a mechanical motion translating device, which is a cam means 36, is provided to obtain a substantially perfect "calibrating frequency" where standard oscillator 21 has substantial frequency error. Cam means 36 may have a cam connected to and actuated by tuning knob 27 and a cam-follower which is actuated by the cam and is coupled to adjustment means within stable oscillator 28. Where stable oscillator 28 is a crystal oscillator, the frequency adjustment means may be a variable capacitor connected in parallel with the crystal; and where the stable oscillator is a tuned L–C oscillator, a trimmer capacitor or trimmer inductance may be coupled to the output of cam-means 36. The engaged cam surface is cut with a variation that depends upon the calibration of standard oscillator 21, so as to vary the frequency $f_2$ in an opposite manner to compensate the "calibration frequency" and maintain a required relationship between dial frequency indication and the calibration frequency, such as the linear relationship indicated by dotted line 22 in Figure 2. Therefore, when cam-means 36 is used, it is the "calibration frequency" which must be precalibrated; and, in this case, it may be realized that oscillator 21 need not be precalibrated at all.

It is apparent in the initial case, where cam-means 36 was not used, that the calibrating frequency obtains its calibration from the fact that oscillator 21 was substantially perfectly calibrated and stable oscillator frequency $f_2$ was permanently fixed.

Calibration for imperfections in standard oscillator 21 may be made in other ways than shown in Figure 1. Another way is to connect the cam-means between knob 27 and the tuning shaft of standard oscillator 21. In this manner, the output of oscillator 21 can be made to provide a frequency $f_1$ which varies linearly with rotation of knob 27, which remains directly connected to receiver tuning shaft 24.

However, it appears that the compensating means shown in Figure 1 is preferable in most cases, because it generally allows greater variation of cam periphery to be used, thus reducing error in the shaping of the cam.

When the oscillator to be calibrated is not part of an assembled receiver, frequency preselector 12, mixer 14 and I. F. amplifier 18 are supplied as separate elements in the test circuit.

Where oscillators 10 and 21 are tuned by a control voltage rather than by a control shaft, a control voltage source (not shown) is controlled by knob 27 and will have control leads substituted for input shaft 26 to standard oscillator 21 and for input shaft 24 to receiver 11. Cam-means 36 may be used in the electrically controlled circuit, because a calibrated knob is still used to indicate frequency; and, therefore, the input to cam-means 36 can be connected to that knob.

It is, therefore, apparent that this invention provides a means for calibrating an oscillator whether the oscillator is tuned by a mechanical shaft or by electrical means.

While a particular embodiment of the invention has been shown and described, it is to be understood that the invention is capable of many modifications. Changes, therefore, in construction and arrangement may be made without departing from the full intended scope of the invention as given by the appended claims.

What is claimed is:

1. A system for determining the frequency error of a given oscillator comprising a standard oscillator that is calibrated to a required degree of accuracy and is of the same type as said given oscillator, said standard oscillator and said given oscillator being tuned as nearly to the same frequency as initial lack of calibration of said given oscillator permits, a stable oscillator providing a fixed frequency output, a first mixer connected to the outputs of said stable oscillator and said standard oscillator to provide first order sum and difference mixed output frequencies, a frequency preselector having its input connected to the output of said first mixer and passing one of the first-order mixed-output frequencies, a second mixer having one input connected to the output of said frequency preselector and the other input connected to the output of said given oscillator, filter means connected to the output of said second mixer to pass only the heterodyned frequency which is the difference between the given oscillator frequency and the preselector output frequency, and means connected to the output of said filter means to reduce the filter means output frequency by the value of the stable oscillator frequency and to detect the remaining frequency which is the frequency error of the given oscillator.

2. A system for comparing the frequency of a local oscillator with a standard oscillator comprising a stable oscillator providing a single-fixed-frequency output, said local oscillator being tuned as nearly to the frequency of said standard oscillator as the pre-existing calibration of said local oscillator will permit, a first mixer connected to the outputs of said stable oscillator and said standard oscillator to provide sum and difference mixed frequencies including first-order components, a preselector filter connected to the output of the first mixer to pass one of its first-order mixed-frequency components, said frequency preselector being tunable to the selected first-order mixed-frequency component, a second mixer receiving the preselector filter output and the local oscillator output, a fixed amplifier connected to the output of the second mixer to pass only a given first-order difference-frequency component, frequency discriminator means receiving the output of the fixed amplifier and tuned to the stable oscillator frequency, whereby said discriminator means provides a direct-voltage output having an amplitude proportional to the frequency deviation between said local oscillator and said standard oscillator.

3. A system for calibrating a given oscillator comprising a standard oscillator of similar construction to the given oscillator and precalibrated to a required degree of accuracy between its indicated frequency and its output frequency, knob means connected to said standard and local oscillators to tune them together, dial means cooperating with said knob means to indicate the output frequency of said standard oscillator to any required degree of accuracy, a stable oscillator providing a fixed-frequency output, a first mixer receiving the outputs of said stable oscillator and said standard oscillator and providing first-order mixed outputs, a tunable preselector filter having its input connected to the output of said first mixer, the knob means also connected to said preselector filter to tune it to one of the first-order outputs of said first mixer, a second mixer having its inputs connected to the preselector filter output and the local oscillator output, a second filter connected to the output of the second mixer to pass a frequency which is the difference between the input frequencies to said second mixer, means for detecting the deviation of the output frequency of the second filter from the stable oscillator frequency, and means for indicating the deviation, whereby the deviation is proportional to the calibration error of said local oscillator at each frequency indicated by said knob means.

4. A system for calibrating a superheterodyne receiver that includes antenna terminals, a frequency preselector, a local oscillator, a mixer for heterodyning the output frequencies of said preselector and local oscillator, an intermediate-frequency amplifier, and tuning means coupled to the frequency preselector and local oscillator; the calibrating system including a precalibrated standard oscillator of the same type as said local oscillator, a tuning device coupled to said standard oscillator and coupled to the receiver tuning means to tune them together, a stable oscillator providing a fixed-frequency output, a calibrating mixer connected to the outputs of said stable oscillator and said standard oscillator, the antenna terminals of said receiver connected to the output of said calibrating mixer, limiter and discriminator means connected to the output of the intermediate-frequency amplifier of said receiver, said discriminator means tuned to the frequency of the stable oscillator, and means for indicating the output of the frequency discriminator, wherein the discriminator output is proportional to the frequency calibration error of the local oscillator.

5. A system for calibrating a local oscillator utilizing a standard oscillator and a stable oscillator comprising a first mixer receiving the outputs of said standard oscillator and said stable oscillator to provide first-order mixed-output components, a preselector filter connected to the first mixer output and passing one of its first-order components to provide the calibrating frequency of the system, a tuning means connected to said standard oscillator and said local oscillator and said preselector filter to tune them together, the calibrating frequency having a precalibrated variation with the adjustment of said tuning means, a second mixer receiving the outputs of said preselector filter and said local oscillator, an intermediate-frequency amplifier connected to the output of the second mixer and having a bandpass that only passes frequencies about the stable oscillator frequency, frequency discriminator means having an input tuned to the stable oscillator frequency, the discriminator means output being proportional to the frequency calibration error of the local oscillator, and indicating means connected to the discriminator output to indicate the calibration error.

6. A system for calibrating a local oscillator utilizing a standard oscillator of the same type and comprising a tuning means connected to said standard and local oscillators to tune them as nearly in unison as any frequency error in the local oscillator will permit, a stable oscillator, a mixer with its two inputs respectively connected to the outputs of said standard oscillator and said stable oscillator, a preselector filter connected to the output of the first mixer to pass one of the first-order components of said first mixer, said preselector filter connected to said tuning means to track with said standard oscillator and said local oscillator, cam means connected between said tuning means and said stable oscillator to vary its output frequency in response to variation of said tuning means to obtain a calibrated relationship between adjustment of said tuning means and the output frequency of said preselector filter, a second mixer having its inputs connected respectively to the preselector filter output and the local oscillator output to heterodyne them, an intermediate-frequency amplifier tuned approximately to the center frequency of said stable oscillator, amplitude-limiting means connected to the output of said intermediate-frequency amplifier, frequency discriminator means connected to the output of said limiting means, the input of said frequency discriminator means being tuned approximately to the center frequency of the stable oscillator, and indicating means connected to the output of the frequency discriminator means to indicate the calibration error of the local oscillator.

7. A system for calibrating a first oscillator comprising a second oscillator of the same type as said first oscillator, a third oscillator having frequency adjusting means, a first mixer receiving the frequency outputs of the second and third oscillators, a frequency preselector connected to the output of the first mixer and selectively passing one of its first order mixed components, tuning means connected to said first and third oscillators and to said frequency preselector to tune them together, cam means including a cam and cam follower, the cam connected to said tuning means, the cam follower connected to the frequency adjustment means of said third oscillator, and the periphery of said cam formed to maintain a calibrated frequency variation between the selected first-order output of said first mixer and adjustment of said tuning means, a second mixer having its inputs connected to the outputs of said frequency preselector and said first oscillator, an amplifying filter connected to the output of the second mixer and passing its mixed first-order difference frequency, limiter and frequency discriminating means connected to the output of the amplifying filter to provide an output that varies in proportion to the calibration error of the local oscillator.

8. A system for calibrating a tunable local oscillator comprising a tunable standard oscillator, a tuning knob connected mechanically to said local oscillator to vary its frequency, a cam means including a cam and a cam follower, with the cam connected to said tuning knob, and the cam follower connected to tune said standard oscillator, the periphery of the cam formed to provide a precalibrated frequency relationship between the adjustment of said knob and the output frequency of said standard oscillator, a stable oscillator having a fixed-frequency output, a first mixer having its inputs connected to the respective outputs of said standard oscillator and said stable oscillator, a frequency preselector having its input connected to the output of said first mixer, the frequency preselector being connected mechanically to said tuning knob and being tuned to one of the first-order mixed-output frequencies of said first mixer, a second mixer having its inputs respectively connected to the outputs of said frequency preselector and said local oscillator, an intermediate-frquency amplifier tuned approximately to the same frequency as said stable oscillator and having its input connected to the output of said second mixer, limiter and frequency discriminator means connected to the output of said intermediate-frequency amplifier to provide a direct-voltage output proportional to the deviation of the output frequency of said intermediate-frequency amplifier from the frequency of the stable oscillator, whereby the output of the discriminator indicates the error in calibration of said local oscillator.

9. A system for calibrating a local oscillator that is tuned by an electrical control voltage comprising a standard oscillator similar to said local oscillator and also tuned by said electrical control voltage, a mechanical tuning device, a control voltage source connected to and controlled by said mechanical tuning device to provide a required type of output control voltage which is connected to said standard oscillator and said local oscillator to tune them, a crystal oscillator, a variable capacitor connected across the crystal of said crystal oscillator for frequency adjustment, a cam means having a cam connected to said mechanical tuning device and a cam follower connected to the variable capacitor of said crystal oscillator, a first mixer having its inputs respectively connected to the outputs of said standard oscillator and said crystal oscillator, a frequency preselector connected to the output of said first mixer to select one of its first-order mixed frequencies, the frequency preselector being tuned in response to said mechanical tuning device to the selected first-order mixed component frequency of said first mixer, a second mixer having its inputs respectively connected to the outputs of said frequency preselector and said local oscillator, an intermediate-frequency amplifier tuned approximately to the frequency of the crystal, frequency discriminator means tuned approximately to the frequency of the crystal and connected to receive the output of the intermediate-frequency amplifier, whereby the output of said discriminator means is proportional to the calibration error of the local oscillator at any setting of said mechanical tuning device.

References Cited in the file of this patent

UNITED STATES PATENTS

| | | |
|---|---|---|
| 2,629,829 | Daly | Feb. 24, 1953 |
| 2,714,657 | Slein | Aug. 2, 1955 |